(12) United States Patent
Han et al.

(10) Patent No.: US 10,063,208 B2
(45) Date of Patent: Aug. 28, 2018

(54) SPEAKER DEVICE AND METHOD FOR REDUCING DISTORTION DEGREE OF SPEAKER

(71) Applicant: Goertek.Inc, Weifang, Shandong (CN)

(72) Inventors: Dan Han, Weifang (CN); Yun Yang, Weifang (CN)

(73) Assignee: Goertek.Inc, Weifang (CN)

( * ) Notice: Subject to any disclaimer, the term of this patent is extended or adjusted under 35 U.S.C. 154(b) by 0 days.

(21) Appl. No.: 15/551,244

(22) PCT Filed: Nov. 16, 2015

(86) PCT No.: PCT/CN2015/094743
§ 371 (c)(1),
(2) Date: Aug. 15, 2017

(87) PCT Pub. No.: WO2016/165322
PCT Pub. Date: Oct. 20, 2016

(65) Prior Publication Data
US 2018/0026600 A1  Jan. 25, 2018

(30) Foreign Application Priority Data
Apr. 13, 2015 (CN) .......................... 2015 1 0172824

(51) Int. Cl.
*H03G 11/04* (2006.01)
*H04R 3/00* (2006.01)
(Continued)

(52) U.S. Cl.
CPC .............. *H03G 11/04* (2013.01); *H04R 3/00* (2013.01); *H04R 9/06* (2013.01); *H04R 29/001* (2013.01)

(58) Field of Classification Search
CPC . H03G 11/04; H04R 3/00; H04R 9/06; H04R 29/001
(Continued)

(56) References Cited

U.S. PATENT DOCUMENTS 6,914,991 B1 * 7/2005 Pompei .................... H04R 3/00
  381/111
7,443,990 B2 * 10/2008 Chattin .................... H04R 3/12
  381/111
(Continued)

FOREIGN PATENT DOCUMENTS

CN         1878431 A    12/2006
CN       101247672 A     8/2008
(Continued)

OTHER PUBLICATIONS

International Search Report dated Feb. 6, 2016 in International Patent Application No. PCT/CN2015/094743.
Written Opinion dated Feb. 6, 2016 in International Patent Application No. PCT/CN2015/094743.

*Primary Examiner* — David Ton
(74) *Attorney, Agent, or Firm* — Venable LLP; Steven J. Schwarz

(57) ABSTRACT

The present invention discloses a speaker device and electronic equipment. The speaker device comprises a speaker body, an audio signal input terminal connected with the speaker body, and a DC voltage signal input terminal connected with the speaker body. The electronic equipment comprises the speaker device and a DC voltage signal output circuit. The present invention further discloses a method for reducing a low frequency distortion degree of the speaker of the electronic equipment, and the method is realized by additionally providing a DC voltage signal to the input end of the speaker. In the present invention, a distortion degree of the speaker device at a low-frequency working condition can be reduced, and inconsistency of low frequency distor-
(Continued)

tion of the speaker device, caused by mass production, can be reduced.

5 Claims, 2 Drawing Sheets

(51) Int. Cl.
*H04R 9/06* (2006.01)
*H04R 29/00* (2006.01)

(58) Field of Classification Search
USPC .......................................................... 381/55
See application file for complete search history.

(56) References Cited

U.S. PATENT DOCUMENTS

| | | | | |
|---|---|---|---|---|
| 2007/0064953 | A1* | 3/2007 | Ishida | H03F 1/52 |
| | | | | 381/55 |
| 2015/0256927 | A1* | 9/2015 | Wood | H04R 3/00 |
| | | | | 363/126 |

FOREIGN PATENT DOCUMENTS

| | | | |
|---|---|---|---|
| CN | 104301847 | A | 1/2015 |
| CN | 204518066 | U | 7/2015 |
| CN | 104918190 | A | 9/2015 |

\* cited by examiner

SPEAKER DEVICE AND METHOD FOR REDUCING DISTORTION DEGREE OF SPEAKER

This application is a National Stage of International Application No. PCT/CN/2015/094743, filed Nov. 16, 2015, which claims priority to Chinese Patent Application No. 201510172824.1, filed Apr. 13, 2015, both of which are hereby incorporated by reference in their entireties.

TECHNICAL FIELD

The present invention relates to a speaker device, electronic equipment, and a method for reducing a low frequency distortion degree of a speaker of the electronic equipment.

BACKGROUND

In a moving coil speaker, a position of a vibration system (including a voice coil and a vibration diaphragm) in a Z-axis direction determines a relative position between the vibration system and a magnetic circuit system, and this relative position affects symmetry between electromechanical coupling factors (BL) and equivalent paraelectric performance (Cms) of the whole system, affecting a vibration state of the system. As a displacement of the vibration system in a low frequency working condition is relatively large, influence of a relative position of the vibration system in the Z-axis under the low frequency on low frequency distortion of the speaker is significant.

At present, due to precision constraints of manufacturing processes and materials, it is hard to reduce the distortion of the speaker in a low frequency condition to be lower than 10%. Or, even if lower distortion of the speaker is realized, it is difficult to guarantee the consistency between products. Therefore, it is necessary to provide a technical scheme that can reduce the low frequency distortion degree of the speaker.

SUMMARY

An object of the present invention is to provide a technical solution for reducing a low frequency distortion degree of a speaker.

According to a first aspect of the present invention, there is provided a speaker device, comprising: a speaker body, an audio signal input terminal connected with the speaker body, and a direct current (DC) voltage signal input terminal connected with the speaker body.

Optionally, the speaker device further comprises a DC voltage signal modulation unit connected with the speaker body and the DC voltage signal input terminal, respectively.

Optionally, the speaker device comprises a voice coil, and a DC voltage signal is applied to the voice coil.

According to a second aspect of the present invention, there is provided electronic equipment, comprising: the speaker device as described above, and a DC voltage signal output circuit connected with the DC voltage signal input terminal.

Optionally, the DC voltage signal output circuit is an adjustable DC voltage signal output circuit.

According to a third aspect of the present invention, there is provided a method for reducing a low frequency distortion degree of a speaker of electronic equipment, the method comprising the following steps: 1) outputting an audio signal and an adjustable DC voltage signal to the speaker; 2) testing distortion degrees of the speaker under different DC voltage signals; and 3) selecting the DC voltage signal under which the distortion degree is the lowest as a DC voltage signal output from the electronic equipment to the speaker.

The present invention further provides a method for reducing a low frequency distortion degree of a speaker of electronic equipment, the method comprising the following steps: 1) providing a DC voltage signal modulation unit in the speaker; 2) outputting an audio signal and a fixed DC voltage signal to the speaker; 3) testing distortion degrees of the speaker under different modulation parameters of the DC voltage signal modulation unit; and 4) selecting the modulation parameter under which the distortion degree is the lowest as a modulation parameter of the DC voltage signal modulation unit, and controlling the electronic equipment to output the fixed DC voltage signal to the DC voltage signal modulation unit.

The technical effect of the present invention is that low frequency distortion can be significantly improved by adding the DC voltage signal at the input end of the speaker, and moreover, the consistency between speaker products can be guaranteed.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

Figure 1:
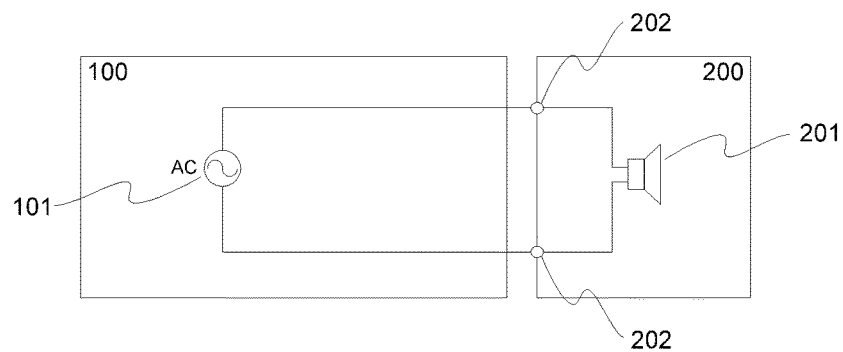
FIG. 1 shows a schematically structural view of existing electronic equipment and a speaker device.

Description of reference numerals: 100: mobile phone output end; 101: audio signal output circuit; 102: DC voltage signal output circuit; 200: speaker end; 201: speaker body; 202, audio signal input terminal; 203, DC voltage signal input terminal; and 204: DC voltage signal modulation unit.

DETAILED DESCRIPTION

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed in the accompanying drawings.

Referring to FIG. 1, an existing mobile phone is taken as an example. Parts related to a speaker in the mobile phone may be abstracted as a mobile phone output end 100 and a speaker end 200. The speaker end 200 comprises a speaker body 201 and an audio signal input terminal 202 connected with the speaker body 201. The mobile phone output end 100 comprises an audio signal output circuit 101. The audio signal output circuit 101 is connected with the audio signal input terminal 202 to output an audio signal (an AC signal) to the speaker body 201.

Figure 2:
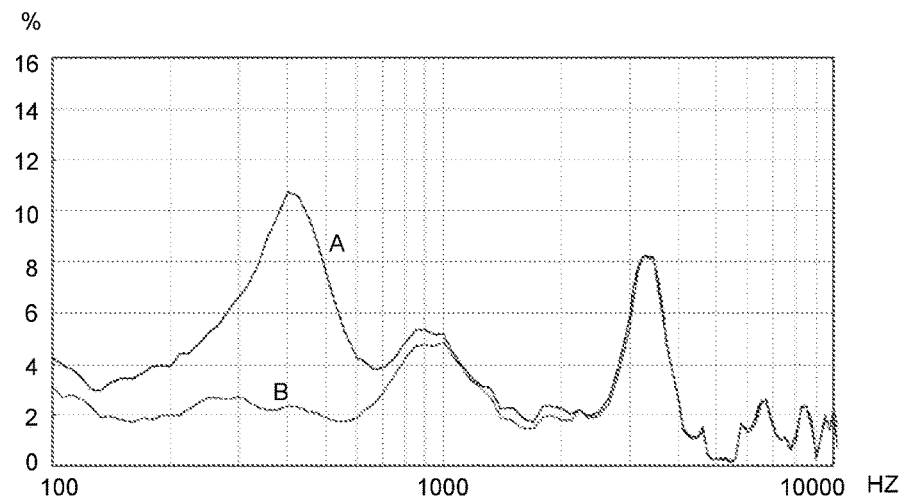
FIG. 2 is a THD curve comparison diagram showing before and after a DC voltage signal is provided in the present invention.
Figure 3:
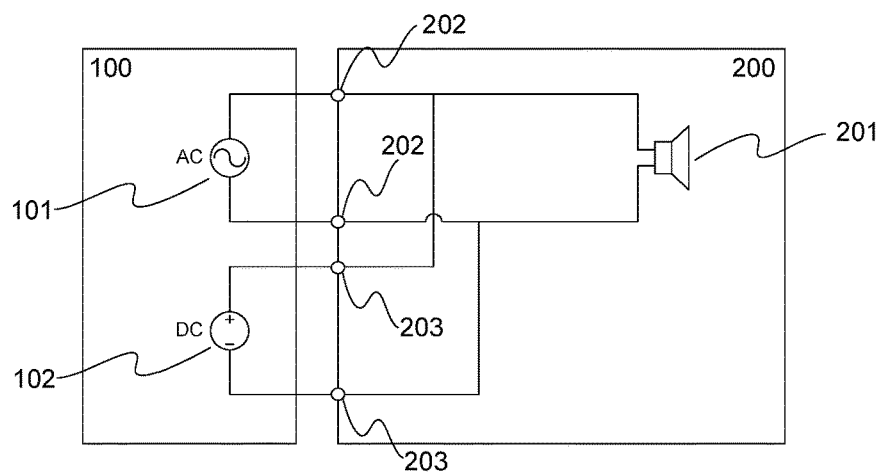
FIG. 3 shows a schematically structural view of electronic equipment and a speaker device according to a first embodiment of the present invention.
Figure 4:
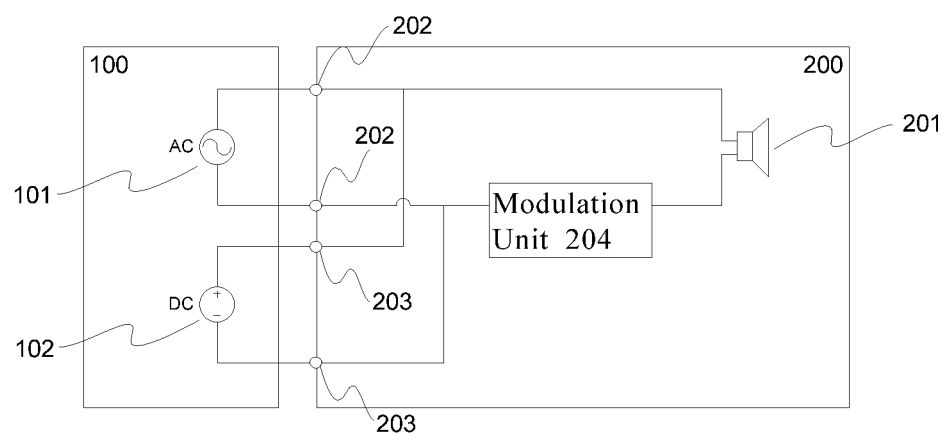
FIG. 4 shows a schematically structural view of the electronic equipment and the speaker device according to a second embodiment of the present invention.

As shown in FIGS. 3 and 4, the improvement of the present invention lies in that the input end of the speaker is additionally provided with a DC voltage bias signal. Referring to THD (Total Harmonic Distortion) curves shown in FIG. 2, the horizontal axis represents working frequencies of the speaker, the vertical axis represents distortion degrees, and a curve A is a previous THD curve of the speaker product. It can be seen that at a low frequency condition of 100 Hz-1,000 Hz, distortion degrees are larger, and a distortion peak value can be greater than 10%. After the DC voltage bias signal is additionally provided, a distortion situation is shown as a curve B. It can be seen that at the low frequency condition of 100 Hz-1,000 Hz, the distortion degrees are significantly reduced.

FIG. 3 shows a schematically structural view of electronic equipment according to a first embodiment of the present invention. The electronic equipment comprises a mobile phone output end 100 and a speaker end 200. The speaker end 200 comprises a speaker body 201, an audio signal input terminal 202 connected with the speaker body 201, and a DC voltage signal input terminal 203 connected with the speaker body 201. The mobile phone output end 100 comprises an audio signal output circuit 101 and a DC voltage signal output circuit 102. The audio signal output circuit 101 is connected with the audio signal input terminal 202 to output an audio signal (an AC signal) to the speaker body 201. The DC voltage signal output circuit 102 is connected with the DC voltage signal input terminal 203 to output a DC voltage signal to the speaker body 201. The speaker body 201 further comprises a voice coil, and the DC voltage signal is applied to the voice coil.

FIG. 4 shows a schematically structural view of the electronic equipment according to a second embodiment of the present invention. The second embodiment differs from the first embodiment in that the speaker end 200 further comprises a DC voltage signal modulation unit 204 connected with the speaker body 201 and the DC voltage signal input terminal 203, respectively. The DC voltage signal output from the DC voltage signal output circuit 102 is modulated by the DC voltage signal modulation unit 204, and then is output to the speaker body 201.

Here, modulation refers to the adjustment of a direction and strength of the DC voltage signal.

The DC voltage signal output circuit 102 may be adjustable, such that different DC voltage signals can be set according to the actual testing conditions when the same mobile phone adopts different speakers.

With respect to individual electronic equipment and a speaker, it is of course desirable to precisely set the DC voltage signal to reduce the distortion degree to the greatest extent. Thus, the present invention further provides a method for reducing a low frequency distortion degree of a speaker of electronic equipment, the method comprising the following steps: 1), outputting an audio signal and an adjustable DC voltage signal to the speaker; 2) testing distortion degrees of the speaker under different DC voltage signals; and 3) selecting the DC voltage signal under which the distortion degree is the lowest as a DC voltage signal output from the electronic equipment to the speaker.

It is available to arrange a DC voltage signal modulation unit in the speaker, and then, the following steps can be performed: 1) outputting an audio signal and a fixed DC voltage signal to the speaker; 2) testing distortion degrees of the speaker under different modulation parameters of the DC voltage signal modulation unit; and 3) selecting the modulation parameter under which the distortion degree is the lowest as a modulation parameter of the DC voltage signal modulation unit, and controlling the electronic equipment to output the fixed DC voltage signal to the DC voltage signal modulation unit.

The present invention has the following benefits.

1. Through improvement, a lower distortion speaker in the prior art becomes an ultra-low distortion speaker.

2. The inconsistency of low frequency distortion of speakers, caused by mass production, is reduced.

Although some specific embodiments of the present invention have been demonstrated in detail with examples, it should be understood by a person skilled in the art that the above examples are only intended to be illustrative but not to limit the scope of the present invention. It should be understood by those skilled in the art that the above embodiments can be modified without departing from the scope and spirit of the present invention. The scope of the present invention is defined by the appended claims.

The invention claimed is:

1. A moving-coil speaker device, comprising: a speaker body including a voice coil and a vibration diaphragm, an audio signal input terminal connected with the speaker body, and a DC voltage signal input terminal connected with the speaker body for applying a DC voltage signal under which the distortion degree is the lowest to the voice coil of the speaker body.

2. The moving-coil speaker device of claim 1, further comprising: a DC voltage signal modulation unit connected with the speaker body and the DC voltage signal input terminal, respectively.

3. An electronic equipment, comprising: the moving-coil speaker device of claim 1, and a DC voltage signal output circuit connected with the DC voltage signal input terminal.

4. The electronic equipment of claim 3, wherein the DC voltage signal output circuit is an adjustable DC voltage signal output circuit.

5. A method for reducing a low frequency distortion degree of a moving-coil speaker of electronic equipment, the method comprising the following steps: outputting an audio signal and an adjustable DC voltage signal to the speaker; testing distortion degrees of the speaker under different DC voltage signals; and selecting the DC voltage signal under which the distortion degree is the lowest as a DC voltage signal output from the electronic equipment to the speaker.

* * * * *